United States Patent [19]

Good

[11] Patent Number: 5,635,888

[45] Date of Patent: Jun. 3, 1997

[54] SUPER-CONDUCTING MAGNETS

[76] Inventor: Jeremy A. Good, 72 Lexham Gardens, London W8, United Kingdom

[21] Appl. No.: 318,806

[22] PCT Filed: Apr. 16, 1993

[86] PCT No.: PCT/GB93/00806

§ 371 Date: Oct. 14, 1994

§ 102(e) Date: Oct. 14, 1994

[87] PCT Pub. No.: WO93/21539

PCT Pub. Date: Oct. 28, 1993

[30] Foreign Application Priority Data

Apr. 16, 1993 [GB] United Kingdom ............... 9208437

[51] Int. Cl.$^6$ ...................................................... H01F 1/00
[52] U.S. Cl. ........................... 335/216; 335/299; 324/318; 62/51.1
[58] Field of Search ................... 335/216, 296, 335/299, 301; 324/318, 319, 320; 62/51.1

[56] References Cited

U.S. PATENT DOCUMENTS

| | | | |
|---|---|---|---|
| 4,782,671 | 11/1988 | Breneman et al. | 62/514 R |
| 4,863,804 | 9/1989 | Whitlow et al. | 428/555 |

FOREIGN PATENT DOCUMENTS

| | | |
|---|---|---|
| 0288835 | 11/1988 | European Pat. Off. . |
| 0350267 | 1/1990 | European Pat. Off. . |
| 0375656 | 6/1990 | European Pat. Off. . |
| 0414443 | 2/1991 | European Pat. Off. . |
| 0450949 | 10/1991 | European Pat. Off. . |
| 62-264605 | 11/1987 | Japan . |
| 2207813 | 2/1989 | United Kingdom . |
| 2259773 | 3/1993 | United Kingdom . |
| 8801074 | 10/1988 | WIPO . |

*Primary Examiner*—Lincoln Donovan
*Attorney, Agent, or Firm*—Ruden, McClosky, Smith, Schuster & Russell, P.A.

[57] ABSTRACT

A super-conducting magnet, particularly suitable for use with an MRI system is provided. The super-conducting magnet includes a closed loop former, a coil winding around the former of a material which is super-conducting at low temperatures, a vacuum vessel containing the former and also of closed loop shape to define a passage through the magnet for receipt of objects to be investigated by nuclear magnetic resonance, electrical connection for the coil winding, a thermal shield within the vacuum vessel and around the former, characterized in that the former is non-electrically conductive and in that refrigeration is provided, operatively connected to the coil winding and the thermal shield, the refrigeration being such that no liquid reservoir for liquid helium or liquid nitrogen is required.

15 Claims, 1 Drawing Sheet

SUPER-CONDUCTING MAGNETS

BACKGROUND OF THE INVENTION

1. Field of the Invention

This invention relates to a super-conducting magnet, in particular to a super-conducting magnet for use in a magnetic resonance imaging system of the type employed for medical diagnostic investigations of the interior of the human body or other tissue.

2. Description of the Prior Art

Magnet resonance imaging systems (hereinafter MRI systems) are employed to image intact biological systems and rely on nuclear magnetic resonance (hereinafter NMR). Like X-rays and ultra-sound procedures, NMR is a non-invasive analytical technique employed to examine a body. Unlike X-rays, however, NMR is a non-ionising, non-destructive process that can be employed continuously. In comparison to ultra-sound, the quality of projections or images produced with NMR are superior.

Basically, NMR is a process that results when nuclei with magnetic moments are subjected to a magnetic field. The NMR technique detects radio-frequency signals emitted from nuclei when exposed to at least two externally applied fields, one of which fields is a strong magnetic field. The magnetic field is required to polarise the nuclei. In the most common use of NMR, which permits imaging or detecting of the distribution of the water which forms some 70% of the human body, the magnetic field is required to polarise the hydrogen nuclei of the water. This, in particular, allows derivation of information of the density and chemical state of the inner soft tissues of the body.

MRI systems have been built with permanent magnets and even with resistive electro-magnets. Such magnets only produce a maximum field of 500–1000 gauss (50–100 mT) with the result that the quality and strength of the magnetic resonance signal is insufficient to obtain a fast and sufficiently detailed picture of the interior of the body. Time is relevant because movement of the patient will result in blurring of the image and for other medical reasons, such as blood flow. A long imaging period also reduces the number of patients who can be examined.

To enable an MRI system to produce faster and more detailed information, i.e. an image with more contrast and better resolution, the strength of the NMR signal must be increased. This is most readily achieved by increasing the strength of the magnetic field used. A suitable field should be at least 3000 and preferably 5000 gauss (at least 300 and preferably 500 mT). In addition, the field should be extremely stable with time and uniform over the whole area in which the body or body part is located.

Super-conducting magnets satisfy all the desiderata and, accordingly, despite their expense, the majority of MRI systems have been constructed with such magnets. U.S. Pat. No. 4,863,804 discloses superconducting wires suitable for use in a superconducting magnet. In a generally employed arrangement, the super-conducting magnet is often provided in the form of a solenoid of 1 m internal diameter, 2–3 m length and a weight of several tonnes. The magnet is often provided with a shield formed, at least externally, of iron to reduce the stray magnetic field which is a potential health hazard. WO88/08200 discloses such an integral external shield for a MR magnet.

A 600 mm internal diameter magnet would be sufficient to accommodate the average human torso but, as noted above, generally, a magnet with a 1 m internal diameter is used. This has the disadvantage that the cost of the magnet is high since, roughly, the stored energy of the coil is proportional to the cube of its inner diameter and its cost may be expected to have a similar proportionality. The reasons why super-conducting magnets of known MRI systems have an internal diameter greater than that which, in principle, is required, are discussed below.

Within the bore of an MRI system super-conducting magnet, pulse coils are fitted whose function is to alter the shape of the magnetic field while the magnetic resonance signal is being created and detected so as to provide the spacial resolution needed to create the image. The coils provide short shaped pulses of magnetic field of considerable energy content. If conductive metal parts are placed close to the exterior of these coils, heavy currents are induced which distort the shape and magnitude of the field pulses and result in a deterioration of image quality. This problem is overcome by making the main super-conducting magnet larger.

Known MRI system super-conducting magnets such as those disclosed in U.S. Pat. No. 4,782,671 and GB-A-2207813 are contained within a reservoir of liquid helium at temperature of 4K and are surrounded by thermal shields which are cooled by liquid nitrogen or by a mechanical refrigerator. Liquid helium is expensive and inconvenient to handle. Great care has to be taken to minimise heat ingress to the liquid helium which would boil it away. In order to ensure that it is absolutely lead-tight, the liquid helium reservoir is normally made of continuously welded metal. The pulse coils will tend to generate eddy currents in this reservoir because of its form, which will cause heating of the metal and loss of the liquid helium. To prevent this, the bore of the helium-cooled magnet be provided with a pulse field shield of metal held at temperature of 40 or 77K and several millimeters thick which absorbs the stray field from the coils. The eddy current heating of this pulse field shield is dissipated by a mechanical refrigerator or by use of boiling liquid nitrogen. The use of the pulse field shield introduces design problems since it must be large so as not to be inductively coupled to the pulse coils which will cause it to interfere with their operation. The need for the shield to be accommodated between the pulse coils inside the magnet and a holy to be investigated by NMR dictates the use of a magnet with an internal bore of much greater diameter than the average body.

SUMMARY OF THE INVENTION

A super-conducting magnet, particularly for use with an MRI system in accordance with the invention, comprises a non-metallic closed loop former, a coil winding around the former of a material which is super-conducting at low temperatures, a vacuum vessel containing the former and also of closed loop shape define a passage through the magnet for receipt of objects to be investigated by nuclear magnetic resonance, electrical connections for the coil winding, a thermal shield within the vacuum vessel around the former characterised in that refrigeration means are provided, operatively connected to the winding and thermal shield, the refrigeration means being such that no liquid reservoir for liquid helium or liquid nitrogen is required.

Very preferably, the refrigeration means comprises a mechanical cryo-refrigerator. The winding material is preferably an intermetallic super-conductor which is super-conducting in a temperature range of 10–12K, which temperatures are maintainable by a mechanical cryo-refrigerator. A super-conducting magnet is, therefore, provided with which liquid helium need not be used. Major advantages result from this: firstly, reduced construction and operational costs; secondly, a smaller stray magnetic field which obviates the need for an external iron shield and makes the magnet easier to install and thirdly, greater ease of operation and design.

Pulse coils are preferably provided which are designed to not be inductively coupled to the coil winding so that they do not induce flux or current changes in that coil.

The vacuum vessel does not have the same design constraints as the liquid helium reservoir necessary with known super-conducting magnets and, in particular, it can be formed from materials which will avoid eddy current generation in the vessel walls. The inner passage-defining bore of the vacuum vessel may be made of fibreglass or a very thin stainless steel, whilst the remainder may be formed from aluminium or stainless steel. No internal pulse shield will be required so that the internal cross-sectional area of the former need only be slightly larger than that of a body or body part with the result that the overall magnet size will be significantly less than that of known magnets.

A radiation shield is preferably provided around the former within the vacuum space. The shield may be made from many thin strips of metal of high conductivity which will reduce or prevent eddy current generation in the shield. At least one end of each of the strips may be thermally anchored to the refrigeration means to maintain the shield at a temperature below 75K and preferably about 50K. The individual anchoring of the strips ensures correct temperature maintenance but without creating any closed electrical circuits so that inductive coupling to the pulse coils is avoided.

A second shield may be provided, closely encasing the former and attached to the winding and/or former. The strips of the second shield will be maintained at a temperature of about 10K. The former may be carried within the vacuum vessel by tensile tie rods made of high-strength, low conductivity material, such as titanium, kelar or glass fibre.

The electrical connectors may comprise electrical leads which pass through insulated terminals in the vacuum wall and down to the winding. The leads are preferably made from a metal which has high electrical and low thermal conductivity, such as brass.

The invention will now be further described with reference to the accompanying drawings in which:

DESCRIPTION OF THE PREFERRED EMBODIMENTS

Figure 1:
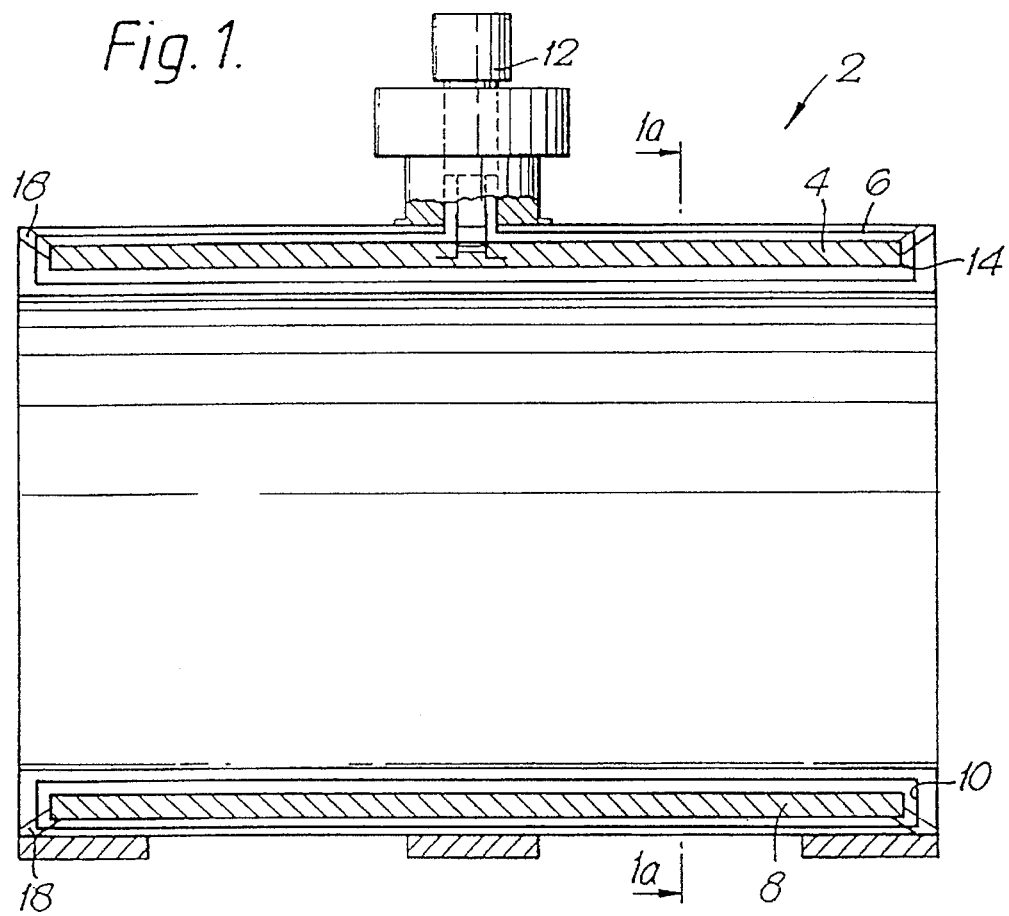
FIG. 1 is a view taken along the vertical centre line of a super-conducting magnet in accordance with the invention.
Figure 1A:
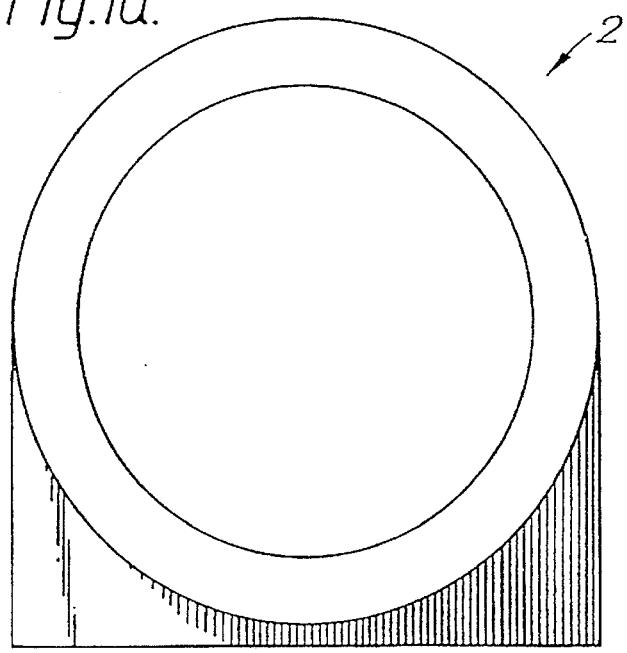
FIG. 1a is a cross-sectional view of the magnet of FIG. 1.

The magnet 2 has a non-metallic former 4 which may be in the form of a glass fibre tube with an approximately 12 mm wall thickness. The former 4 is mounted within a vacuum vessel 6 which may also be in the shape of a tube. The inner bore of the vacuum vessel 6 is made of fibreglass or a very thin stainless steel to avoid eddy currents. The external walls of the vacuum vessel may be constructed from a metal such as aluminium or stainless steel. A winding 8 of a material which is super-conducting at temperatures in the range of about 10–12K is wound onto the former 4.

The winding 8 may be formed from an intermetallic conductor, such as NbSn. NbSn wire is normally produced from a "green state material" consisting of filaments of Bn drawing in a bronze wire of copper tin alloy or co-drawn with nearly tin filaments in copper wire. The wire, which will be ductile at this stage, will have thousands of Nb filaments running continuously along its length, all surrounded by tin bearing copper. The wire is then heated in a vacuum or inert gas to about 700° C., at which temperature tin reacts with the Nb to form NbSn. The reaction proceeds slowly over 10–200 hours.

Generally, coils are produced by the "wind and react method", that is, the coils are wound and then the NbSn conductive filaments are created by heating as described above. No further movement of the turns is allowed so that the brittle nature of the NbSn does not effect performance.

In contrast to this, the winding 8 is preferably formed with the NbSn super-conducting wire in the already reacted state. This avoids the problems of differential thermal contractions after reaction, so allowing a very accurate winding to be obtained. The reaction to create the NbSn conductor from the green state material is not carried through to completion, i.e., some Nb is left unreacted at the centre of each filament of NbSn. If this is done, then it has been found readily possible to produce coils of 300 mm diameter or more.

The winding 8 could be formed from other super-conducting materials, such as ceramic copper oxide super-conductors, the so-called "high Tc conductors".

A radiation shield 10 is provided around the former within the vacuum space. The shield 10 is formed from multiple thin strips of metal of high conductivity so as to avoid the generation of eddy currents in the shield 10. At least one end of each of these strips is thermally anchored to a mechanical cryo-refrigerator 12 whereby the shield 10 is maintained at a temperature well below 75K and preferably around 50K.

A thick blanket of multi-layer super-insulation, not shown, is positioned between the shield 10 and the walls of the vacuum vessel 6. This reduces thermal radiation on the shield 10 and allows it to run at the lowest operating temperature.

A second shield 14 encloses the former 4 and winding 8. The shield 14 is also formed from multiple strips of thin high conductivity metal, with the strips in this case being glued to the coil windings 8 and to the former 4. At least one end of each of these strips of the second shield 14 is thermally anchored to the second stage of the mechanical cryo-refrigerator 12 whereby the shield 14 is maintained at a temperature of about 10K.

The mechanical cryo-refrigerator 12, which is shown schematically in FIG. 1, is suitably mounted in the lowest magnetic field position.

Tensile tie rods, one of which is shown schematically at 18, formed from high-strength, low conductivity material, such as titanium, kevlar or glass fibre, mount the former 4 within the vacuum vessel 6. The tie rods are, suitably strong enough to allow the magnet 2 to be transported in a fully assembled "ready to go" condition.

Electrical leads, not shown, pass through insulated terminals in the wall of the vacuum vessel 6 and down to the winding 8. The leads are preferably made from a metal which has a high electrical Conductivity but a low thermal conductivity, such as brass. The metal should have an electrical conductivity which does not vary too rapidly as a function of temperature, or the performance of the leads will be difficult to predict and to control. The leads are preferably permanently mounted to the vacuum vessel wall and permanently attached to the winding 8. The leads are thermally grounded, both at the point where they pass through the shield and at their connection to the winding. This ensures that the winding 8 is kept as cold as possible. The cross-sectional area of the leads is optimised relative to the length and conductivity of the material from which they are formed to give the lowest heat load on the cold stage when the magnet energisation current is flowing therein.

To provide the highest stability, a super-conducting switch is fitted across the magnet. This allows the magnet to be operated in persistent mode.

The magnet 2 is very suitable for magnetic resonance imaging of the whole body, or of a smaller part, such as an arm, head or leg. No liquid reservoir for liquid helium or liquid nitrogen is required. Such reservoirs are expensive to make as they must be leak-tight and once made, the magnet cannot be inspected or modified. Further they interfere with the operation of the imaging system pulse coils which force the use of a shield in the inner wall. This is not necessary with the magnet 2 which can, therefore, be made simply as large as is necessary to accommodate a whole body or simply a body part.

The magnet 2 is simpler in design and can be made smaller than known super-conducting magnets for MRI systems. The cost thereof will be significantly less than that of such known super-conducting magnets. In addition, the operating costs will be reduced as the need to replenish liquid helium is obviated.

I claim:

1. A superconducting magnet for use with a magnetic resonance imaging system comprising a non-metallic closed loop former, a coil winding around the former of a material which is superconducting at low temperatures, a vacuum vessel containing the former and also of a closed loop shape to define a passage through the magnet for receipt of objects to be investigated by nuclear magnetic resonance, electrical connections for the coil winding, a thermal shield within the vacuum vessel and around the former, characterised in that refrigeration means (12) are provided, operatively connected to the coil winding (8) and the thermal shield (10), the refrigeration means (12) being such that no liquid reservoir for liquid helium or liquid nitrogen is required.

2. A superconducting magnet as claimed in claim 1 wherein the refrigeration means (12) comprises a mechanical cryo-refrigerator.

3. A superconducting magnet as claimed in claim 1 or 2 wherein the coil winding (8) is formed of a material which is superconducting at temperatures in the range of 10 to 12K.

4. A superconducting magnet as claimed in claim 1 wherein the coil winding (8) is formed of an intermetallic superconducting material.

5. A superconducting magnet as claimed in claim 4 wherein the intermetallic superconducting material is NbSn or a ceramic copper oxide superconductor.

6. A superconducting magnet as claimed in claim 1 comprising a number of pulse coils adapted to provide short, shaped pulses of magnetic field so as to alter the shape of the magnetic field produced by the coil winding (8) and so configured as not to be inductively coupled to the coil winding (8).

7. A superconducting magnet as claimed in claim 1 comprising a second shield (14) closely encasing the former and attached to the coil winding (8) and/or the former (4).

8. A superconducting magnet as claimed in claim 1 wherein the or each shield (10,14) comprises a plurality of thin strips of metal of high electrical conductivity, each strip being thermally connected to the refrigeration means (12).

9. A superconducting magnet as claimed in claim 8 wherein the inner passage-defining bore of the vacuum vessel (6) is formed of a material of low electrical conductivity.

10. A superconducting magnet as claimed in claim 1 wherein the material of low electrical conductivity is fibreglass or very thin stainless steel.

11. A superconducting magnet as claimed in any preceding claim wherein the former (4) is supported within the vacuum vessel (6) by tie rods (18) formed of a high strength, low conductivity material, such as titanium, kevlar or glass fibre.

12. A superconducting magnet as claimed in claim 1 wherein the electrical connections comprise leads connected to the coil winding (8) and passing through insulated terminals in the wall of the vacuum vessel (6).

13. A superconducting magnet as claimed in claim 12 wherein the leads are formed of a metal having high electrical and low thermal conductivity, such as brass.

14. A superconducting magnet as claimed in any preceding claim comprising a super-conducting switch connected across the magnet.

15. The use of a superconducting magnet as claimed in claim 1 in a method of magnetic resonance imaging comprising analysing the nuclear magnetic resonance produced by a body subjected to the magnetic field produced thereby.

* * * * *